United States Patent
Tseng et al.

(10) Patent No.: US 10,320,348 B2
(45) Date of Patent: Jun. 11, 2019

(54) DRIVER CIRCUIT AND OPERATIONAL AMPLIFIER CIRCUIT USED THEREIN

(71) Applicant: NOVATEK MICROELECTRONICS CORP., HsinChu (TW)

(72) Inventors: De-Shiou Tseng, Taichung (TW); Wei-Ta Chiu, New Taipei (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/854,046

(22) Filed: Dec. 26, 2017

(65) Prior Publication Data

US 2018/0294785 A1    Oct. 11, 2018

Related U.S. Application Data

(60) Provisional application No. 62/483,473, filed on Apr. 10, 2017.

(51) Int. Cl.
*H03F 3/45* (2006.01)
*G05F 1/56* (2006.01)
(Continued)

(52) U.S. Cl.
CPC ......... *H03F 3/45654* (2013.01); *G05F 1/561* (2013.01); *H03F 1/025* (2013.01); *H03F 1/0222* (2013.01); *H03F 3/3022* (2013.01); *H03F 3/45179* (2013.01); *H03F 3/45475* (2013.01); *H03F 3/45708* (2013.01); *H03F 3/45713* (2013.01); *H03K 17/223* (2013.01); *H03F 2200/511* (2013.01); *H03F 2200/516* (2013.01); *H03K 2217/0081* (2013.01)

(58) Field of Classification Search
CPC ........................................................ H03F 3/456
See application file for complete search history.

(56) References Cited

U.S. PATENT DOCUMENTS

2006/0091955 A1* 5/2006 Choi .................. H03F 1/08
330/260
2008/0191804 A1* 8/2008 An ................... H03F 3/3023
330/255

(Continued)

OTHER PUBLICATIONS

TIPO Office Action dated Feb. 22, 2019 in Taiwan application (No. 107109508).

*Primary Examiner* — Patricia T Nguyen
(74) *Attorney, Agent, or Firm* — McClure, Qualey & Rodack, LLP

(57) ABSTRACT

A driver circuit including a first op-amp, a second op-amp, and a power switching circuit is provided. The first op-amp includes a first input stage circuit for generating a first amplified signal and a first output stage circuit. The second op-amp includes a second input stage circuit for generating a second amplified signal and a second output stage circuit. The power switching circuit includes a first output terminal for outputting one of the first amplified signal and the second amplified signal and a second output terminal for outputting the other of the first amplified signal and the second amplified signal. The power switching circuit is configured to switch a first power supply for both the first input stage circuit and the second input stage circuit between a first supply voltage and a second supply voltage in response to the control signal.

21 Claims, 20 Drawing Sheets

(51) Int. Cl.
*H03K 17/22* (2006.01)
*H03F 1/02* (2006.01)
*H03F 3/30* (2006.01)

(56) References Cited

U.S. PATENT DOCUMENTS

| | | | |
|---|---|---|---|
| 2009/0146738 A1* | 6/2009 | Chang | H03F 1/086 330/255 |
| 2010/0289568 A1* | 11/2010 | Eschauzier | H03F 3/347 330/9 |
| 2011/0007058 A1* | 1/2011 | Hisano | G09G 3/3688 345/211 |
| 2012/0127138 A1* | 5/2012 | Tsuchi | H03F 1/0261 345/204 |
| 2016/0180764 A1 | 6/2016 | Noh et al. | |

* cited by examiner

DRIVER CIRCUIT AND OPERATIONAL AMPLIFIER CIRCUIT USED THEREIN

This application claims the benefit of US provisional application Ser. No. 62/483,473, filed Apr. 10, 2017, the disclosure of which is incorporated by reference herein in its entirety.

TECHNICAL FIELD

The disclosure relates in general to a driver circuit and an operational amplifier circuit used therein, and more particularly to a driver circuit and an operational amplifier circuit capable of switching between different operating voltage levels.

BACKGROUND

As technology advances in the electronics industry, mobile phones and portable devices have become popular in our daily life. Mobile phones are usually equipped with flat panel displays to display information. Among various types of flat panel displays, liquid crystal display (LCD) is the most mature technology and is also most popularized. With the increasing demand on display size and resolution, the number of output buffers in the source driver increases as well. As a consequence, power consumed by the output buffers greatly determines the power consumption of the source driver. In addition, with the greater variety functions provided by the portable electronic products, low power requirement for the output buffers becomes very important.

SUMMARY

One of the purposes of the present disclosure is to provide a driver circuit and an operational amplifier circuit capable of switching between different operating voltage levels. Based on the architecture proposed in this disclosure, the power consumption of the driver circuit and the operational amplifier circuit can be reduced.

According to one embodiment of the invention, a driver circuit is provided. The driver circuit includes a first operational amplifier circuit, a second operational amplifier circuit, and a power switching circuit. The first operational amplifier circuit includes a first input stage circuit and a first output stage circuit. The first input stage circuit receives a first input signal and amplifies the first input signal to generate a first amplified signal. The first output stage circuit generates a first output signal. The second amplifier circuit includes a second input stage circuit and a second output stage circuit. The second input stage circuit receives a second input signal and amplifies the second input signal to generate a second amplified signal. The second output stage circuit generates a second output signal. The power switching circuit is coupled to the first input stage circuit and the second input stage circuit. The power switching circuit includes a first output terminal for outputting one of the first amplified signal and the second amplified signal in response to a control signal and a second output terminal for outputting the other of the first amplified signal and the second amplified signal in response to the control signal. The first output stage circuit is coupled to the first output terminal of the power switching circuit. The second output stage circuit is coupled to the second output terminal of the power switching circuit. The power switching circuit is configured to switch a first power supply for both the first input stage circuit and the second input stage circuit between a first supply voltage and a second supply voltage in response to the control signal.

According to one embodiment of the invention, an operational amplifier circuit in a driver circuit for driving a panel is provided. The operational amplifier circuit includes an input stage circuit, an output stage circuit, and a first power switching circuit. The input stage circuit is configured to receive a gamma voltage as an input signal and amplify the input signal to generate an amplified signal. The input signal has an input range dynamically varied between a first input range and a second input range. The output stage circuit is coupled to the input stage circuit for receiving the amplified signal to generate an output signal. The first power switching circuit is coupled to the input stage circuit for switching a first power supply for the input stage circuit between a first supply voltage and a second supply voltage according to whether the input signal is in the first input range or the second input range.

The invention will become apparent from the following detailed description of the preferred but non-limiting embodiments. The following description is made with reference to the accompanying drawings.

Figure 1:
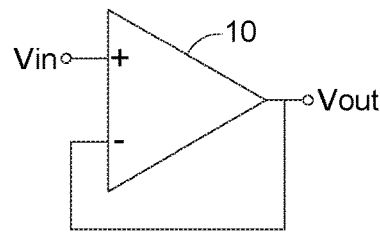
FIG. 1 shows an example output buffer circuit including an operational amplifier circuit.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 shows an example output buffer circuit including an operational amplifier circuit 10. In this example, the output terminal is coupled to the negative input terminal of the operational amplifier circuit 10 to form a buffer circuit. The positive input terminal of the operational amplifier circuit 10 acts as the input for the buffer circuit. The operational amplifier circuit 10 may be powered by a positive power supply (such as +18V, +VDD) and a negative power supply (such as 0V, GND or −VSS). The charging and discharging operation and the power consumption of the operation amplifier circuit 10 are determined by the positive power supply and the negative power supply.

In the following description, an operational amplifier circuit capable of switching operation voltage levels based on the input gamma voltage will be provided. In one embodiment, the voltage range supplied to the operational amplifier circuit can be reduced such that the power consumption is reduced accordingly. A driver circuit incorporating such operation amplifier circuit will also be provided. The configuration of the output buffer circuit shown in FIG. 1 will be used as an illustrative example for the operational amplifier circuits in the following embodiments. That is, one of the input terminals of the operational amplifier circuit is fed back from the output terminal of the operational amplifier circuit. However, the circuit configuration shown in FIG. 1 is merely exemplary rather than limiting the invention. The operational amplifier circuits provided below may also be applied to other circuit configurations.

Figure 2:
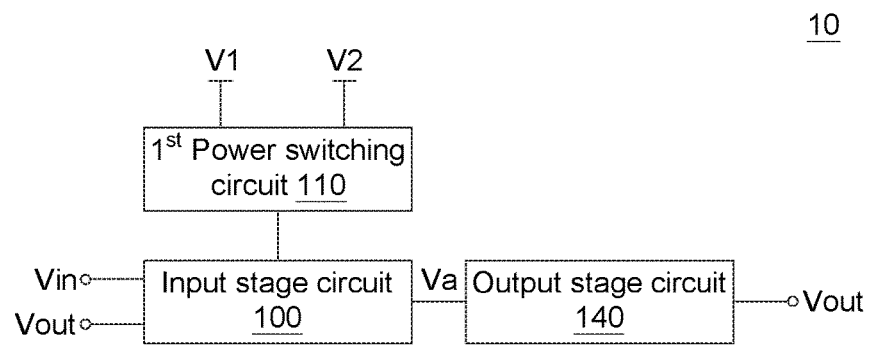
FIG. 2 shows a block diagram of an operational amplifier circuit according to one embodiment of the invention.

FIG. 2 shows a block diagram of an operational amplifier circuit according to one embodiment of the invention. The operational amplifier circuit 10 includes an input stage circuit 100, an output stage circuit 140, and a first power switching circuit 110. The input stage circuit 100 is configured to receive a gamma voltage as an input signal Vin and amplify the input signal Vin to generate an amplified signal Va. The input signal Vin has an input range dynamically varied between a first input range and a second input range. The output stage circuit 140 is coupled to the input stage circuit 100 for receiving the amplified signal Va to generate an output signal Vout. The first power switching circuit 110 is coupled to the input stage circuit 100 for switching a first power supply (for example, the positive power supply) for the input stage circuit 100 between a first supply voltage V1 and a second supply voltage V2 according to whether the input signal Vin is in the first input range or the second input range.

The input signal Vin is the gamma voltage for driving a pixel in the display device. In one embodiment, the first input range may be higher than the second input range of the input signal Vin. For example, the first input range corresponds to voltage with positive polarity, and the second input range corresponds to voltage with negative polarity. Reducing the voltage level of the positive power supply will not affect the correctness of the circuit function if the input signal Vin is in the second input range. One example of switching operating voltage levels is as follows: when the input signal Vin is in the first input range, the input stage circuit 100 is powered by the first supply voltage V1, such as +18V. When the input signal Vin is in the second input range, the input stage circuit 100 is powered by the second supply voltage V2, such as +9V. The power consumption can be effectively reduced by dynamically adjusting the supply voltage level for the operational amplifier circuit 10. Embodiments regarding each circuit block in FIG. 2 will be described below.

In one embodiment, the first power switching circuit 110 includes a multiplexer (MUX). The multiplexer is configured to generate the first power supply for the input stage circuit 100 by multiplexing the first supply voltage V1 and the second supply voltage V2 according to whether the input signal Vin is in the first input range or the second input range. In one embodiment, the multiplexer receives a control signal indicating whether the input signal Vin is in the first input range or the second input range.

Figure 3:
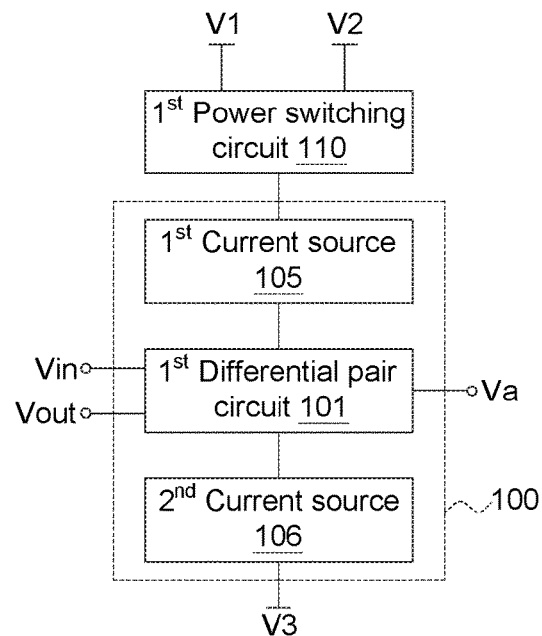
FIG. 3 shows a block diagram of the input stage circuit according to one embodiment of the invention.

FIG. 3 shows a block diagram of the input stage circuit according to one embodiment of the invention. The input stage circuit 100 includes a first differential pair circuit 101 coupled to the first power switching circuit 110 through a first current source 105 and coupled to a third supply voltage V3 through a second current source 106. One possible implementation for the first current source 105 as well as the second current source 106 is a current mirror circuit. The first differential pair circuit 101 may be a n-channel metal-oxide-semiconductor field effect transistor (NMOS) differential pair, a p-channel MOSFET (PMOS) differential pair, a combination of NMOS and PMOS differential pairs, or a bipolar junction transistor (BJT) differential pair.

In one embodiment, the second supply voltage V2 is between the first supply voltage V1 and the third supply voltage V3. Note that the relative position between the first supply voltage V1, the second supply voltage V2, and the third supply voltage V3 depicted in FIG. 3 does not necessarily correspond to the relative voltage level.

In one embodiment, the first differential pair circuit 101 is an NMOS differential pair circuit. The first supply voltage V1 is greater than the second supply voltage V2, and the second supply voltage V2 is greater than the third supply voltage V3. For example, the first voltage V1=+18V, the second supply voltage V2=+9V, and the third supply voltage V3=0V. In this example the full range for the power supply is 18V.

There are two operation modes for this input stage circuit 100. In the first mode, the positive power supply and the negative power supply are the first supply voltage V1 and the third supply voltage V3 respectively. In the second mode, the positive power supply and the negative power supply are the second supply voltage V2 and the third supply voltage V3 respectively. In the following description, a supply pair consisting of the first supply voltage V1 and the third supply voltage V3 will be referred as the "full range". A supply pair consisting either "the first supply voltage V1 and the second supply voltage V2" or "the second supply voltage V2 and the third supply voltage V3" will be referred as the "half range". Although the naming "half range" is used here, the voltage level of the second supply voltage V2 is not necessarily exactly the half between the first supply voltage V1 and the third supply voltage V3. For example, the first voltage V1, the second supply voltage V2, and the third supply voltage V3 may be +10V, +5.5V, and 0V, respectively. The number for the voltage levels of the first supply voltage V1, the second supply voltage V2, and third supply voltage V3 provided in this disclosure are just exemplary rather than limiting.

In another embodiment, the first differential pair circuit 101 is a PMOS differential pair circuit. The third supply voltage V3 is greater than the second supply voltage V2, and the second supply voltage V2 is greater than the first supply voltage V1. In other words, in the first mode, the positive power supply and the negative power supply are the third supply voltage V3 and the second supply voltage V2 respectively. In the second mode, the positive power supply and the negative power supply are the third supply voltage V3 and the first supply voltage V1 respectively.

Figure 4:
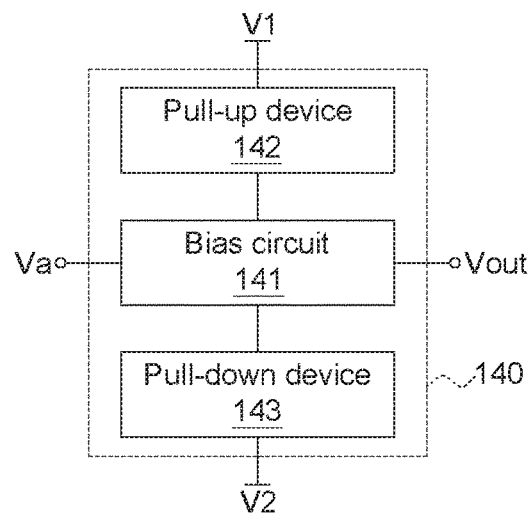
FIG. 4 shows a block diagram of the output stage circuit according to one embodiment of the invention.

FIG. 4 shows a block diagram of the output stage circuit according to one embodiment of the invention. In this embodiment, the output stage circuit 140 is power supplied by the first supply voltage V1 and the second supply voltage V2. The output stage circuit 140 includes a bias circuit 141. The bias circuit 141 is coupled to the first supply voltage V1 through a pull-up device 142. The bias circuit 141 is coupled to the second supply voltage V2 through a pull-down device 143. The pull-up device may include a PMOS transistor, and the pull-down device 143 may include an NMOS transistor. In another embodiment, the output stage circuit 140 is power supplied by the second supply voltage V2 and the third supply voltage V3. As shown in FIG. 4, the output stage circuit 140 is supplied by the half range and thus the power consumption can be reduced.

Figure 5:
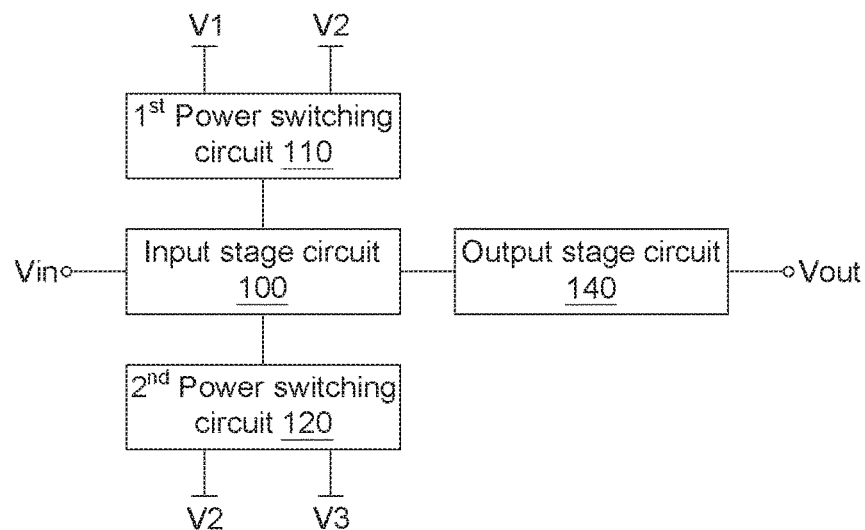
FIG. 5 shows a block diagram of an operational amplifier circuit including two power switching circuits according to one embodiment of the invention.

FIG. 5 shows a block diagram of an operational amplifier circuit including two power switching circuits according to one embodiment of the invention. In this embodiment, the operational amplifier circuit 11 includes a second power switching circuit 120 in addition to the first power switching circuit 110 shown in FIG. 2. The second power switching circuit 120 is coupled to the input stage circuit 100 for switching a second power supply (for example, the negative power supply) for the input stage circuit 100 between the second supply voltage V2 and the third supply voltage V3.

In the embodiment shown in FIG. 5, there are two operation modes for this input stage circuit 100. In the first mode, the positive power supply and the negative power supply are the first supply voltage V1 and the second supply voltage V2 respectively. In the second mode, the positive power supply and the negative power supply are the second supply voltage V2 and the third supply voltage V3 respectively.

Figure 6:
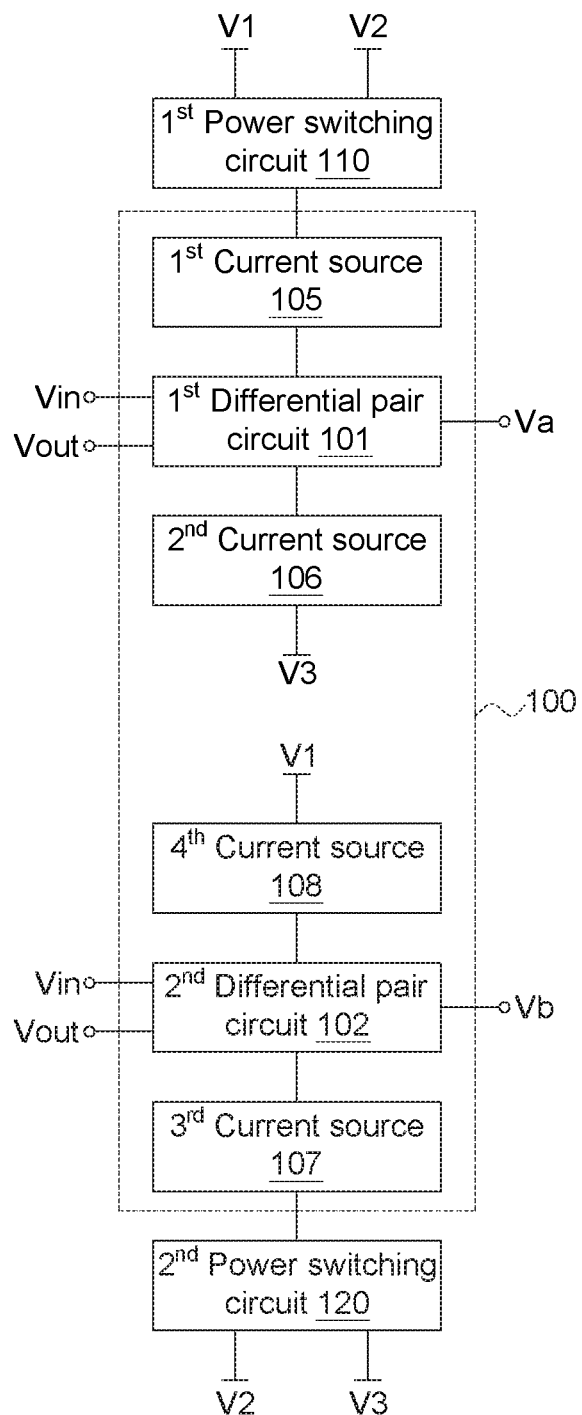
FIG. 6 shows a block diagram of the input stage circuit including the second differential pair circuit according to one embodiment of the invention.

FIG. 6 shows a block diagram of the input stage circuit including the second differential pair circuit according to one embodiment of the invention. In this embodiment, the input stage circuit 100 includes a second differential pair circuit 102 in addition to the first differential pair circuit 101 shown in FIG. 3. The second differential pair circuit 102 is coupled to the second power switching circuit 120 through a third current source 107 and coupled to the first supply voltage V1 through a fourth current source 108. The third current source 107 and the fourth current source 108 may be implemented by a current mirror circuit. The first differential pair circuit 101 and the second differential pair circuit 101 may include transistors with different polarities. For example, the first differential pair circuit 101 is an NMOS differential pair, and the second differential pair circuit 102 is a PMOS differential pair. In this embodiment, the first supply voltage V1 is greater than the second supply voltage V2. The second supply voltage V2 is greater than the third supply voltage V3. The second differential pair circuit 102 outputs an amplified signal Vb, which may be different from the amplified signal Va generated by the first differential pair circuit 101. The output stage circuit 140 receives the amplified signal Va and the amplified signal Vb to generate the output signal Vout.

Figure 7:
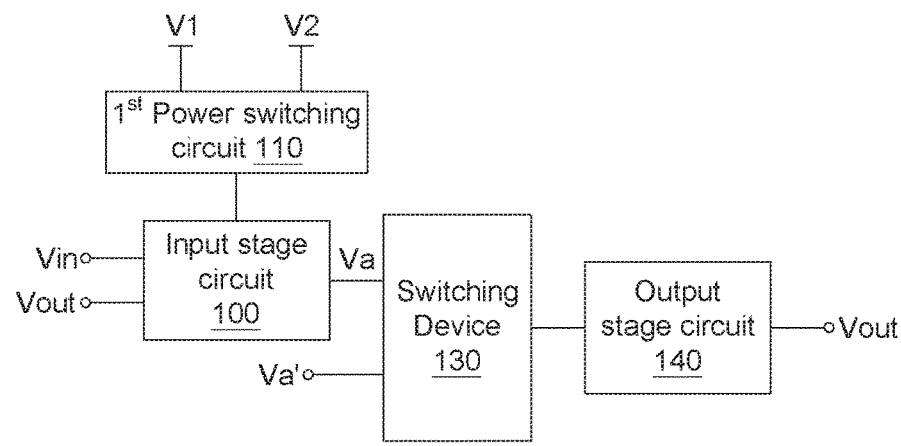
FIG. 7 shows a block diagram of an operational amplifier circuit including a switching device according to one embodiment of the invention.

FIG. 7 shows a block diagram of an operational amplifier circuit including a switching device according to one embodiment of the invention. In this embodiment, the operational amplifier circuit 12 includes a switching device 130 coupled between the input stage circuit 100 and the output stage circuit 140. The switching device 130 is configured to multiplex the amplified signal Va and another amplified signal Va' generated by another input stage circuit according to whether the input signal Vin is in the first input range or the second input range.

For example, the switching device 130 is coupled to two input stage circuits, each of which may be implemented according to the embodiment shown in FIG. 3 or FIG. 6. The switching device 130 multiplexes the outputs from these two input stage circuits to the output stage circuit 140. In one embodiment, the input stage circuit 100 may also be coupled to the second power switching circuit 120 for switching the second power supply for the input stage circuit 100 according to the embodiment shown in FIG. 5. In one embodiment, two operational amplifier circuits as shown in FIG. 7 may be combined to create a driver circuit, which is illustrated in FIG. 8.

Figure 8:
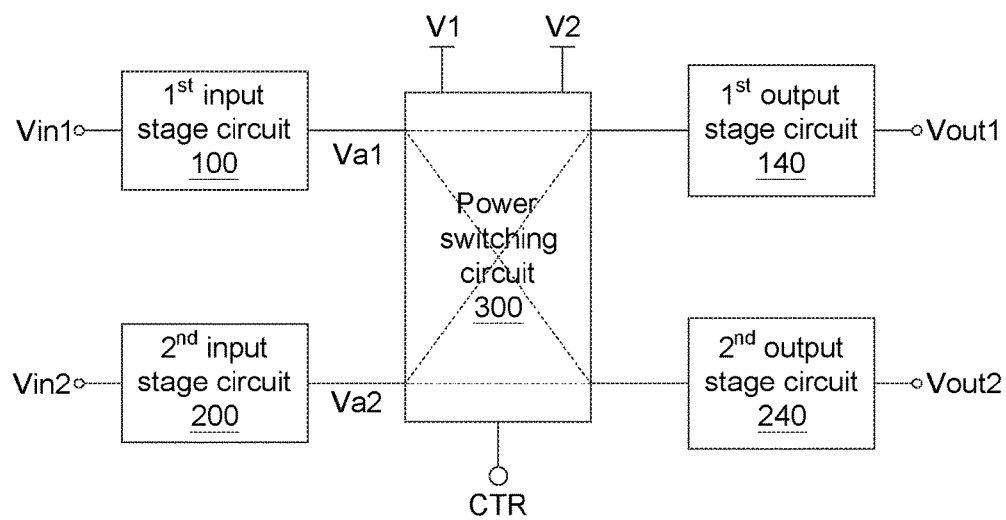
FIG. 8 shows a block diagram of a driver circuit according to one embodiment of the invention.

FIG. 8 shows a block diagram of a driver circuit according to one embodiment of the invention. The driver circuit 20 includes a first operational amplifier circuit, a second operational amplifier circuit, and a power switching circuit 300. The first operational amplifier circuit includes a first input stage circuit 100 and a first output stage circuit 140 for generating a first output signal Vout1. The first input stage circuit 100 receives a first input signal Vin1 and amplifies the first input signal Vin1 to generate a first amplified signal Va1. The second operational amplifier circuit includes a second input stage circuit 200 and a second output stage circuit 240 for generating a second output signal Vout2. The second input stage circuit 200 receives a second input signal Vin2 and amplifies the second input signal Vin2 to generate a second amplified signal Va2.

The power switching circuit 300 is coupled to the first input stage circuit 100 and the second input stage circuit 200. The power switching circuit 300 includes a first output terminal and a second output terminal. The first output terminal outputs one of the first amplified signal Va1 and the second amplified signal Va2 in response to a control signal CTR. The second output terminal outputs the other one of the first amplified signal Va1 and the second amplified signal Va2 in response to the control signal CTR. The first output stage circuit 140 is coupled to the first output terminal of the power switching circuit 300. The second output stage circuit 240 is coupled to the second output terminal of the power switching circuit 300. The power switching circuit 300 is configured to switch a first power supply (for example, the positive power supply) for both the first input stage circuit 100 and the second input stage circuit 200 between a first supply voltage V1 and a second supply voltage V2 in response to the control signal CTR.

The driver circuit 20 shown in FIG. 8 may be regarded as combining two operational amplifier circuits according to the embodiments shown in FIG. 2-FIG. 7. The power switching circuit 300 not only switches the supply voltage for both the input stage circuits 100 and 200, but also controls the coupling relationship between the first input stage circuit 100, the second input stage circuit 200, the first output stage circuit 140, and the second output stage circuit 240. The control signal CTR may indicate whether the first input signal Vin1 is in the first input range or the second input range.

For example, the full range (such as 0V-18V) for the driver circuit 20 may be divided into an upper half range (such as 9V-18V) and a lower half range (such as 0V-9V). The first output stage circuit 140 may be dedicated to operate in the upper half range, and the second output stage circuit 240 may be dedicated to operate in the lower half range. When the first input signal Vin1 is in the first input range, the first input stage circuit 100 is coupled to the first output stage circuit 140 in response to the control signal CTR. When the first input signal Vin1 is in the second input range, the first input stage circuit 100 is coupled to the second output stage circuit 240 in response to the control signal CTR. The second input stage circuit 200 for receiving the second input signal Vin2 works similarly as described above. In this embodiment, the supply voltage for the first and second output stage circuits 140 and 240 is half range. The supply voltage for the first and second input stage circuits 100 and 200 may be switched according to the control signal CTR. As such, the driver circuit 20 is capable of switching the operating voltage levels, and the power consumption can be reduced accordingly.

In one embodiment, the first input stage circuit 100 includes a first differential pair circuit coupled to a third supply voltage V3 through a first current source. An example block diagram can be referred in FIG. 3. The first input stage circuit 100 may optionally include an additional second differential pair circuit, as illustrated in FIG. 6. The second input stage circuit 200 and the first input stage circuit 100 may have similar circuit structure. For example, the second input stage circuit 200 also includes a third differential pair circuit coupled to the third supply voltage V3 through a third current source. The second supply voltage V2 is between the first supply voltage V1 and the third supply voltage V3.

In one embodiment, the first differential pair circuit in the first input stage circuit 100 is an NMOS differential pair circuit. The third differential pair circuit in the second input stage circuit 200 is another NMOS differential pair circuit. The first supply voltage V1 is greater than the second supply voltage V2, and the second supply voltage V2 is greater than the third supply voltage V3. In another embodiment, the first differential pair circuit in the first input stage circuit 100 is a PMOS differential pair circuit. The third differential pair circuit in the second input stage circuit 200 is another NMOS differential pair circuit. The third supply voltage V3 is greater than the second supply voltage V2, and the second supply voltage V2 is greater than the first supply voltage V1.

In one embodiment, the first output stage circuit 140 is power supplied by the first supply voltage V1 and the second supply voltage V2. The second output stage circuit 240 is power supplied by the second supply voltage V2 and the third supply voltage V3. That is, the first output stage circuit 140 and the second output stage circuit 240 serve for different operation voltage level conditions. The block diagram of the first output stage circuit 140 may be referred in FIG. 4. The second output stage circuit 240 may have similar circuit structure to the first output stage circuit 140.

In one embodiment, the power switching circuit 300 is further configured to switch a second power supply (for example, the negative power supply) for both the first input stage circuit 100 and the second input stage circuit 200 between the second supply voltage V2 and the third supply voltage V3. One example may be referred to the operational amplifier circuit 11 shown in FIG. 5, which has both the first power switching circuit 110 and the second power switching circuit 120.

In one embodiment, the first input stage circuit 100 includes a second differential pair circuit in addition to the first differential pair circuit. The second differential pair circuit is coupled to the first supply voltage V1 through a second current source. One such example may be referred in FIG. 6. The second input stage circuit 200 includes a fourth differential pair circuit in addition to the third differential pair circuit. The fourth differential pair circuit is coupled to the first supply voltage V1 through a fourth current source. The first supply voltage V1 is greater than the second supply voltage V2, and the second supply voltage V2 is greater than the third supply voltage V3.

Several embodiments regarding the driver circuit and the operational amplifier circuit used therein will be provided in FIG. 9A-FIG. 16B. In the following description, operation amplifier circuits shown in two figures sharing the same Arabic number, such as FIG. 9A and FIG. 9B, may be paired together to form a driver circuit as illustrated in FIG. 8. The operational amplifier circuit in the figure indexed with A will be referred as the first operational amplifier circuit, while the operational amplifier circuit in the figure indexed with B will be referred as the second operational amplifier circuit. For example, the operation amplifier circuit in FIG. 10A may be combined with the operational amplifier circuit in FIG. 10B to form a driver circuit. The same applies to FIG. 11A and FIG. 11B, FIG. 12A and FIG. 12B, and so on.

Figure 9A:
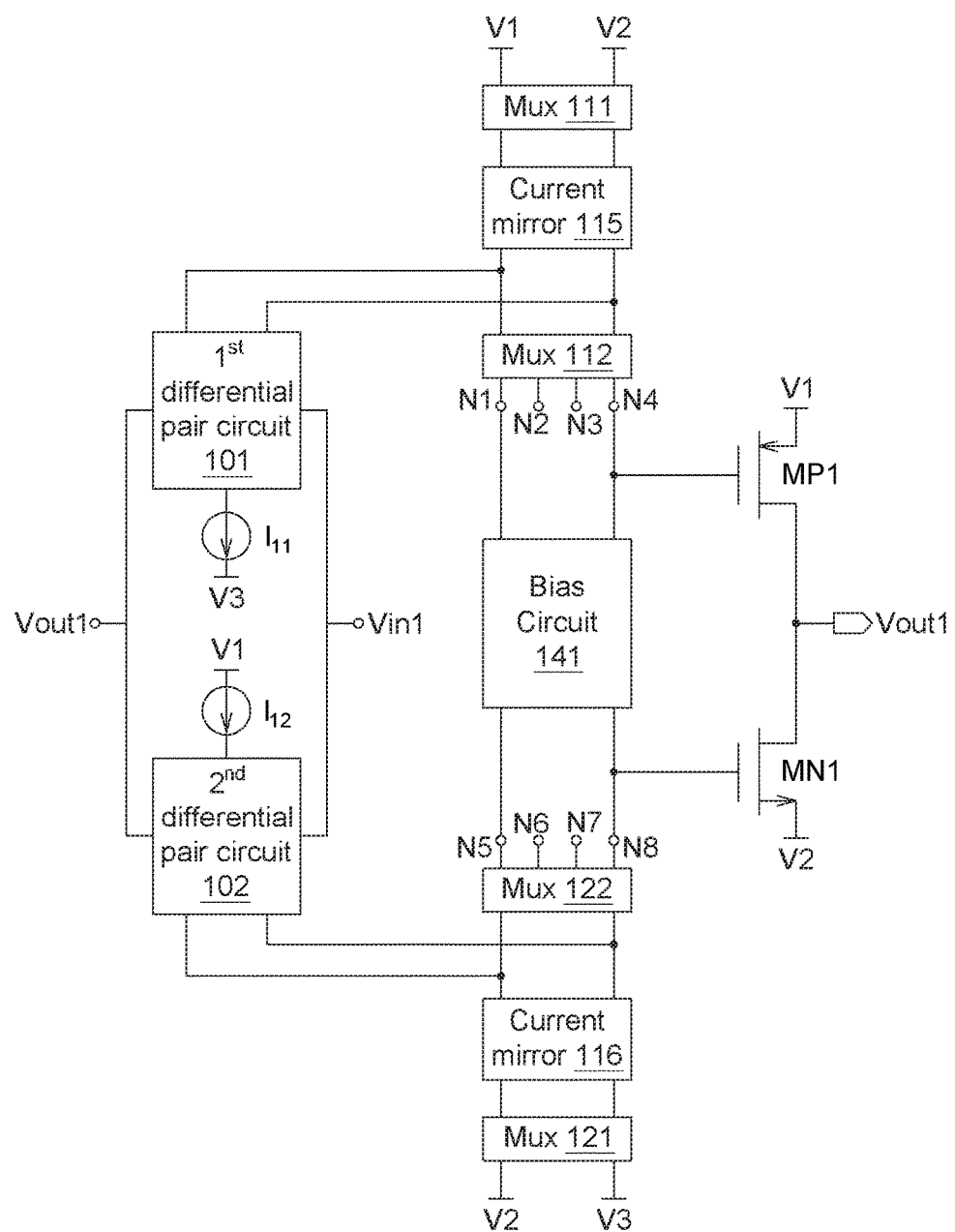
FIG. 9A shows an operational amplifier circuit according to one embodiment of the invention.
Figure 9B:
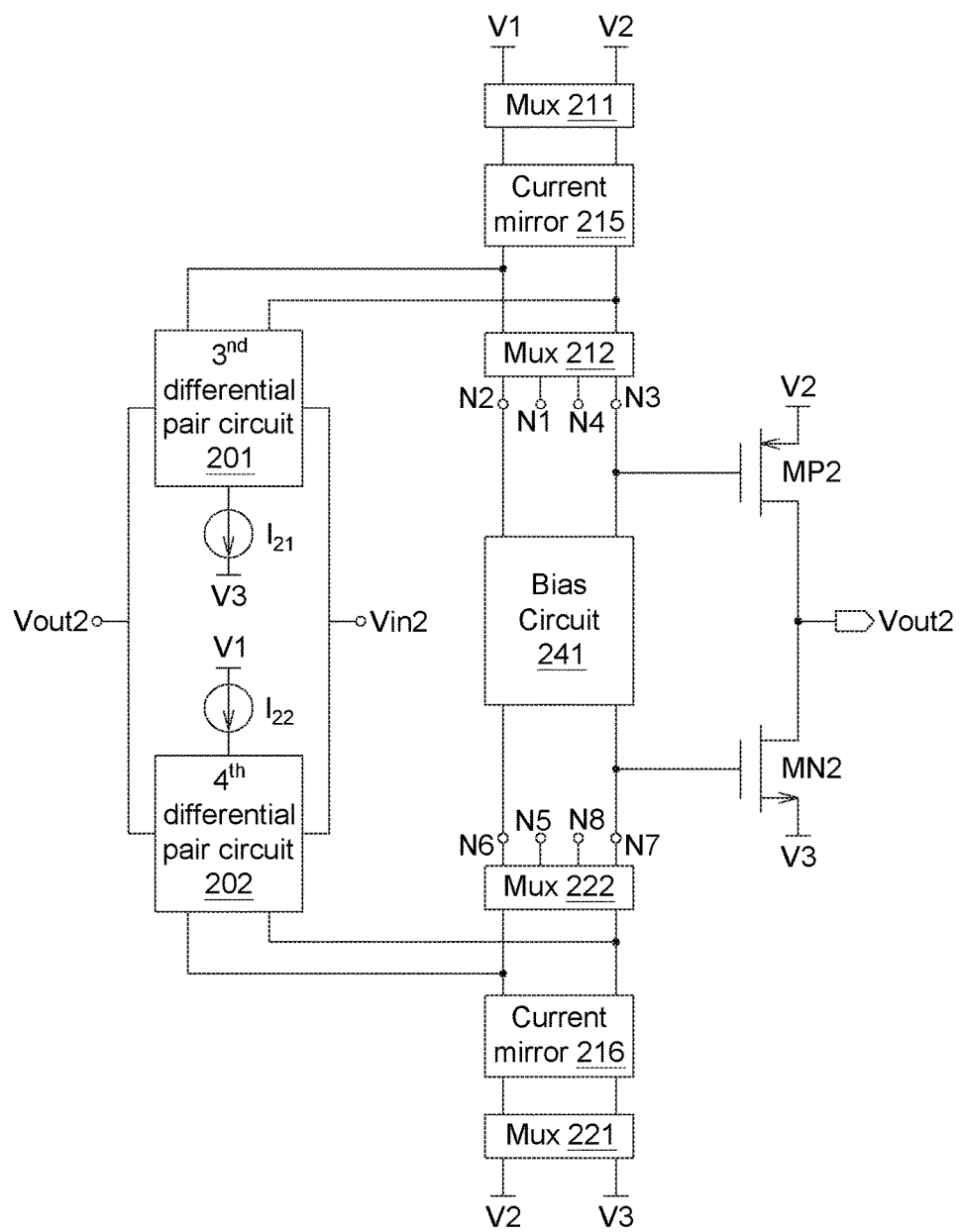
FIG. 9B shows an operational amplifier circuit that may be combined with the operational amplifier circuit shown in FIG. 9A according to one embodiment of the invention.

FIG. 9A shows an operational amplifier circuit according to one embodiment of the invention. FIG. 9B shows an operational amplifier circuit that may be combined with the operational amplifier circuit shown in FIG. 9A according to one embodiment of the invention. Refer to FIG. 4, in this embodiment, the pull-up device 142 in the output stage circuit 140 of the first operational amplifier circuit includes the PMOS transistor MP1, and the pull-down device 143 includes the NMOS transistor MN1. The output stage circuit 140 of the first operational amplifier circuit in FIG. 9A is powered by the first supply voltage V1 and the second supply voltage V2. The second operational amplifier circuit in FIG. 9B has similar output stage circuit, including the PMOS transistor MP2 and the NMOS transistor MN2, and is powered by the second supply voltage V2 and the third supply voltage V3. The transistors in the output stage circuit 140 may be large enough to provide sufficient driving strength for the loading circuit. This exemplary architecture of the output stage circuit 140 in FIG. 9A and FIG. 9B will be used in the following embodiments as well. However, the invention is not limited to such output stage architecture.

The circuit architecture used in the embodiment in FIG. 9A is corresponding to the embodiment shown in FIG. 6. The first input stage circuit 100 includes the first differential pair circuit 101 and the second differential pair circuit 102. The first current source 105, the second current source 106, the third current source 107, the fourth current source 108, the first power switching circuit 110, and the second power switching circuit 120 in FIG. 6 are corresponding to the current mirror 115, the current source $I_{11}$, the current mirror 116, the current source $I_{12}$, the mux 111 (the mux 112 may also be optionally incorporated into the first power switching circuit 110), and the mux 121 (optionally in combination with the mux 122) in FIG. 9A, respectively. The current mirror 115 and the current mirror 116 set the operating point for the bias circuit 141. The second operational amplifier circuit in FIG. 9B has architecture similar to that in FIG. 9A.

The mux 111, mux 121, mux 211, and mux 221 control the supply voltage for the input stage circuit. The mux 112, mux 122, mux 212, and mux 222 control the coupling relationship between the two input stage circuits and the two output stage circuits, as illustrated in FIG. 8. The power switching circuit 300 in FIG. 8 includes all the multiplexers shown in FIG. 9A and FIG. 9B. The nodes N1, N2, N3, N4, N5, N6, N7, and N8 represent the connection between the first operational amplifier circuit and the second operational amplifier circuit. For example, the node N1 in FIG. 9A is coupled to the node N1 in FIG. 9B, the node N2 in FIG. 9A is coupled to the node N2 in FIG. 9B, and so on. In this embodiment, eight connection wires (N1 to N8) are required between the first operational amplifier circuit and the second operational amplifier circuit.

The power switching circuit 300 in FIG. 8 (including all the multiplexers in FIG. 9A and FIG. 9B) controls the operation mode based on the first input signal Vin1 and the second input signal Vin2. For example, when the control signal CTR indicates that the first input signal Vin1 is in the first input range (such as high gamma voltage), the mux 111 selects the first supply voltage V1, the mux 121 selects the second supply voltage V2, the mux 112 and the mux 122 makes the input stage circuit in FIG. 9A coupled to the output stage circuit in FIG. 9A, which is powered by the first supply voltage V1 and the second supply voltage V2. When the first input signal Vin1 is in the second input range (such as low gamma voltage), the mux 111 selects the second supply voltage V2, the mux 121 selects the third supply voltage V3, the mux 112 and the mux 122 makes the input stage circuit in FIG. 9A coupled to the output stage circuit in FIG. 9B, which is powered by the second supply voltage V2 and the third supply voltage V3. Similarly, the operation of the second operational amplifier circuit may be controlled based on the second input signal Vin2. In one embodiment, all the multiplexers in FIG. 9A and FIG. 9B are controlled by the same control signal CTR. Signal polarity inversion may be needed between the first operational amplifier circuit and the second operational amplifier circuit depending on the circuit implementation.

Figure 10A:
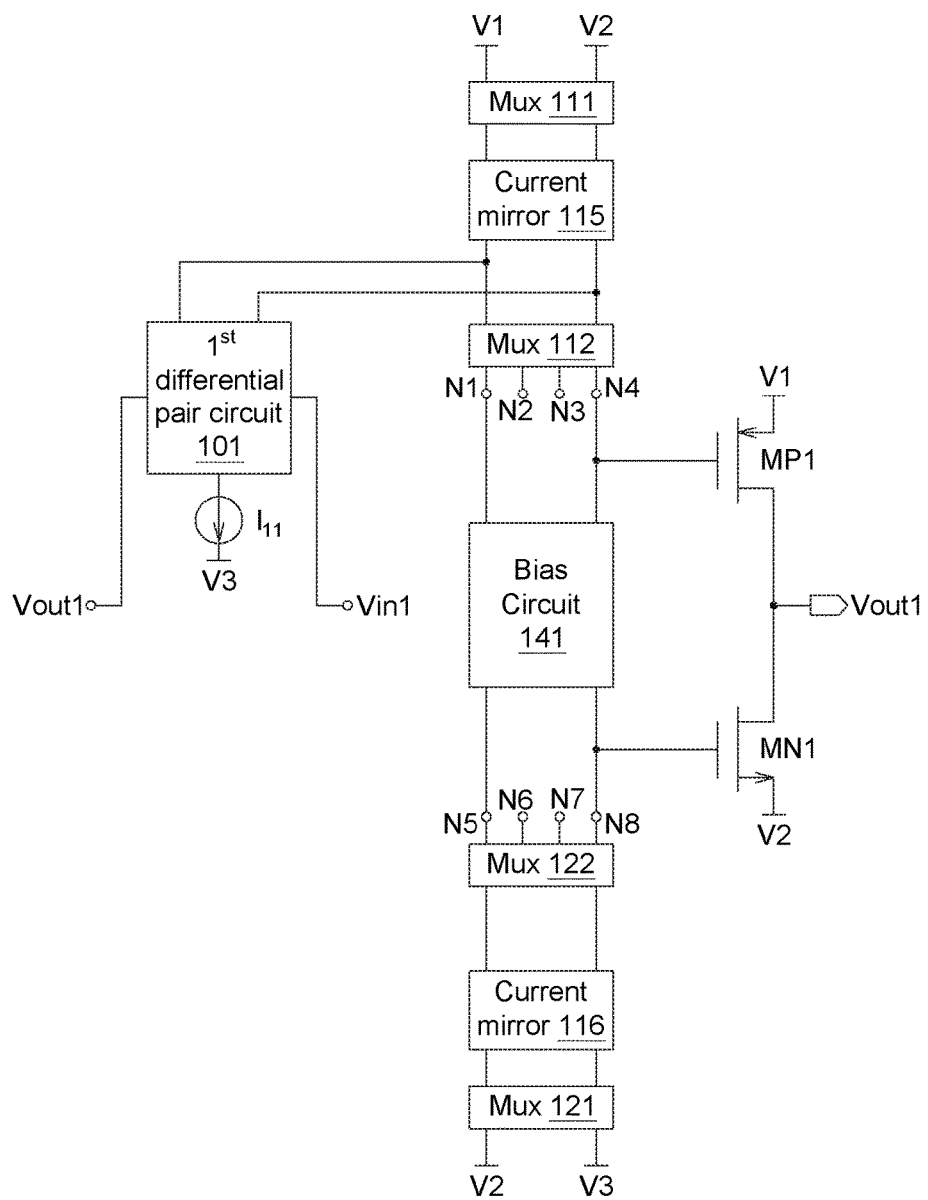
FIG. 10A shows an operational amplifier circuit according to one embodiment of the invention.
Figure 10B:
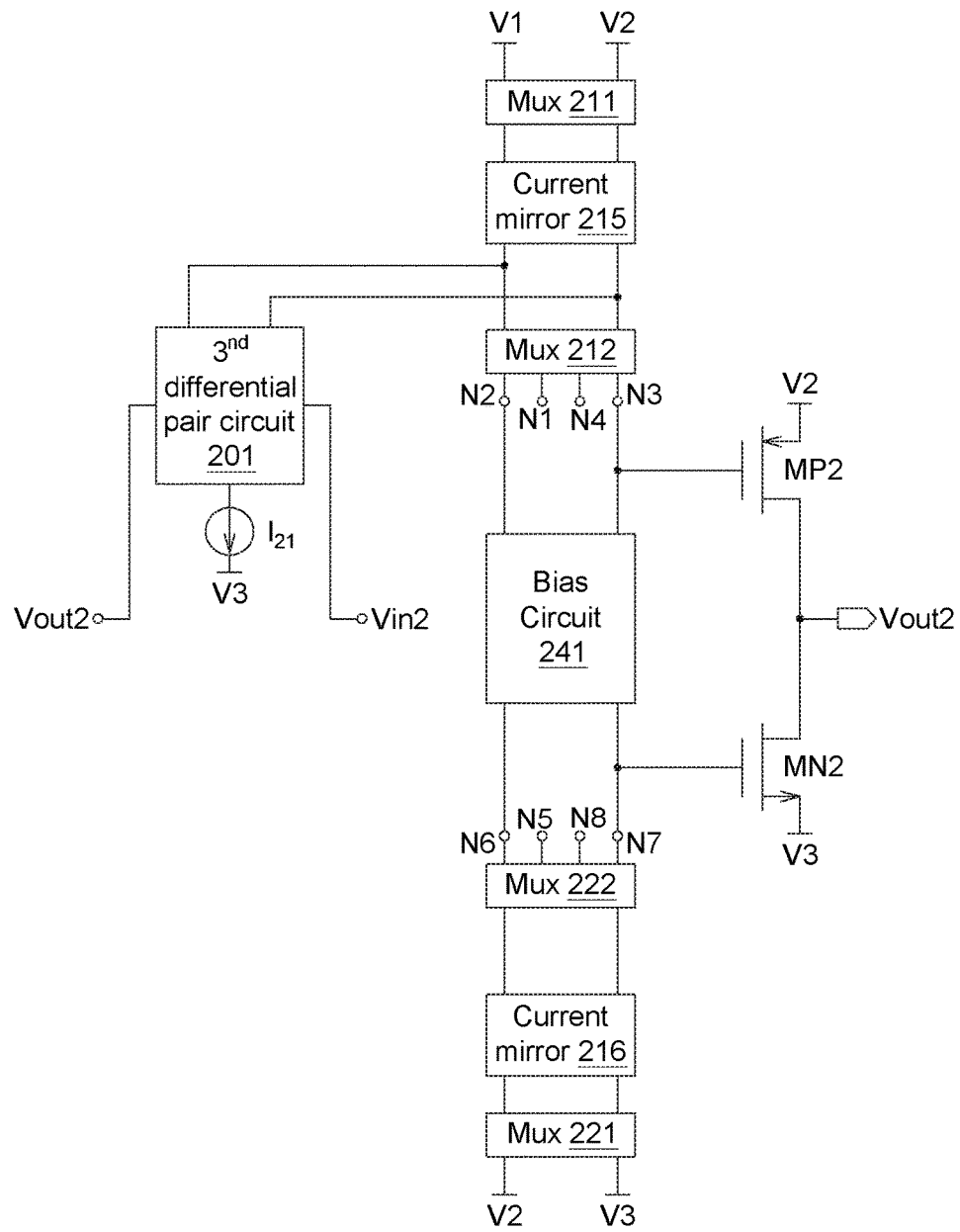
FIG. 10B shows an operational amplifier circuit that may be combined with the operational amplifier circuit shown in FIG. 10A according to one embodiment of the invention.
Figure 11A:
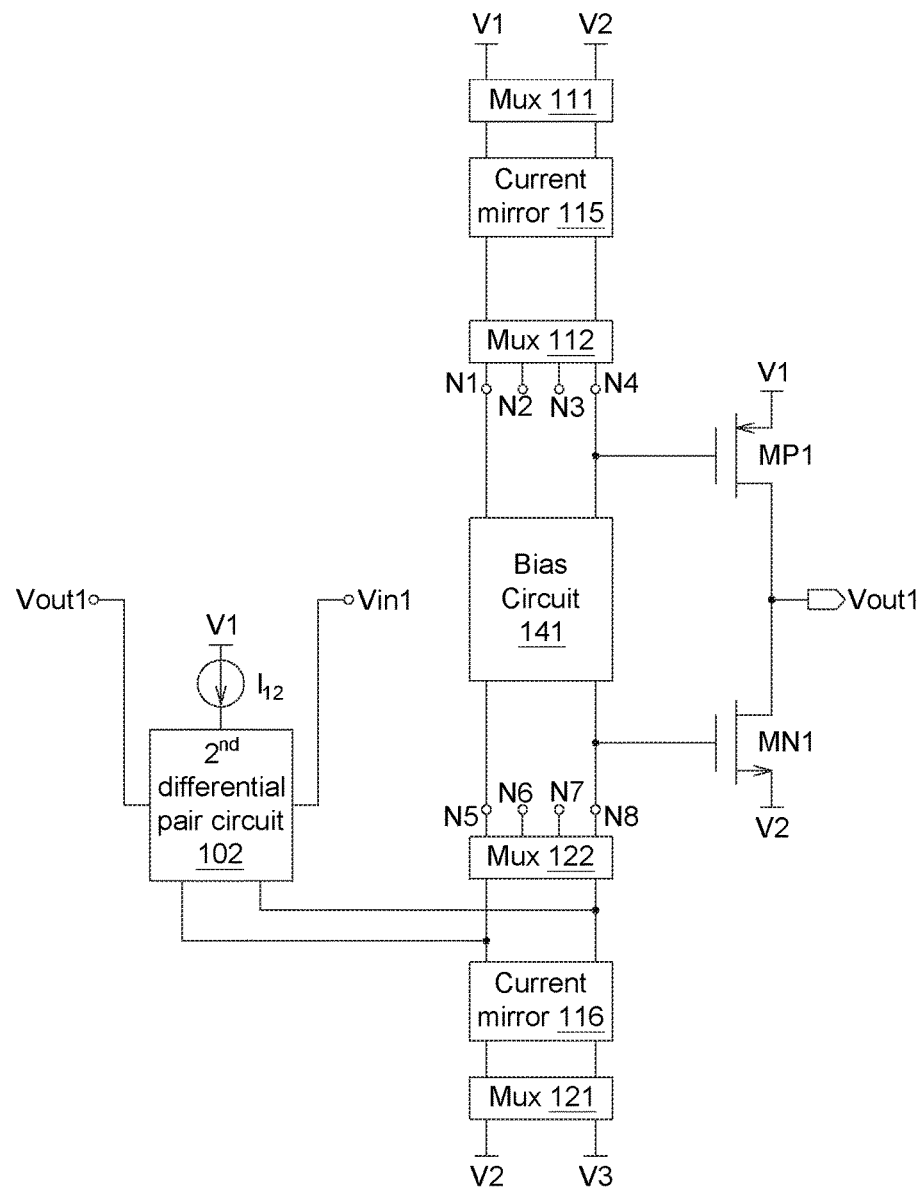
FIG. 11A shows an operational amplifier circuit according to one embodiment of the invention.
Figure 11B:
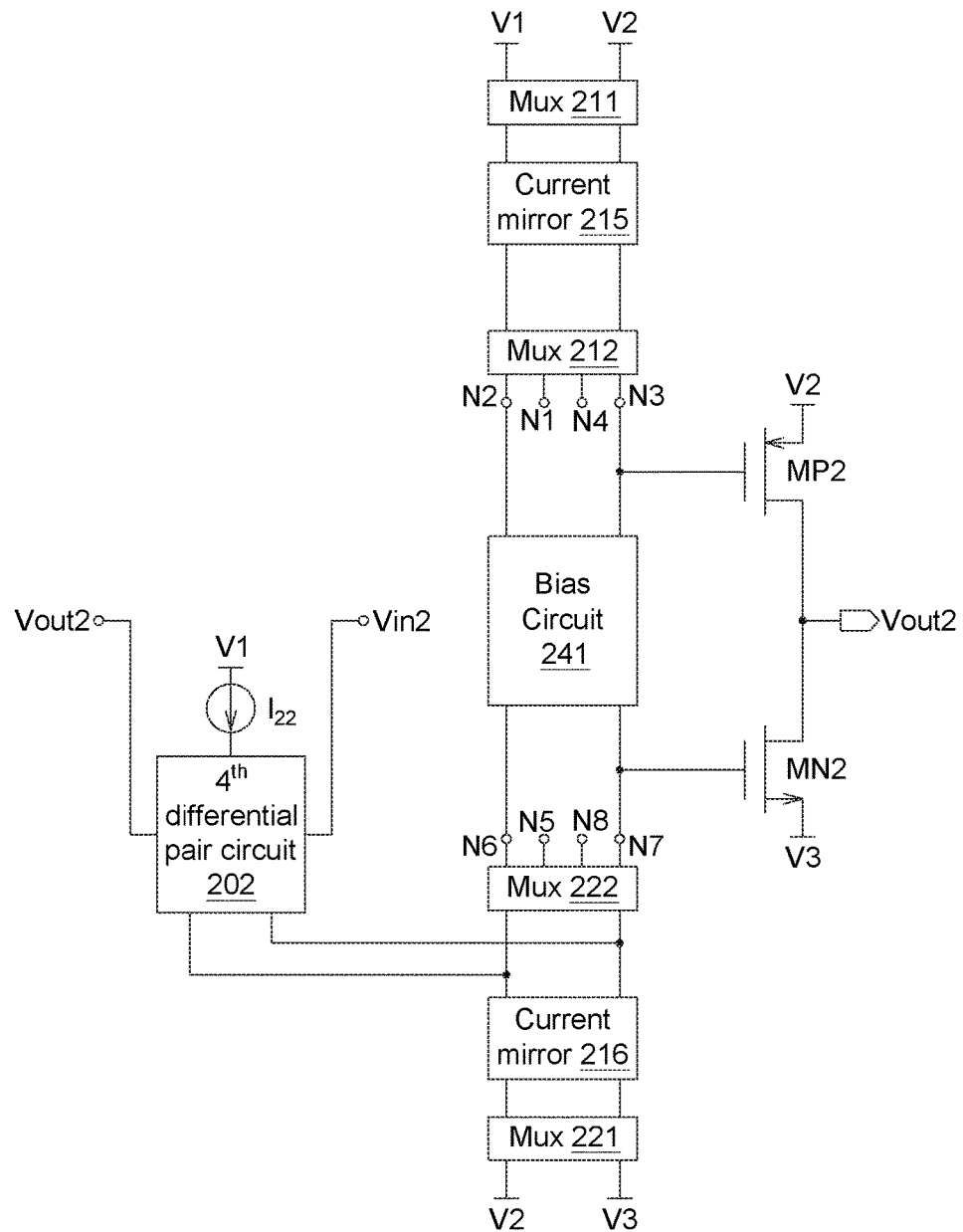
FIG. 11B shows an operational amplifier circuit that may be combined with the operational amplifier circuit shown in FIG. 11A according to one embodiment of the invention.

By adjusting the manufacturing process, the input stage of the operational amplifier circuit may be accomplished with a single differential pair circuit. FIG. 10A-FIG. 13B show embodiments adopting the single differential pair circuit architecture. Embodiments in FIG. 10A and FIG. 10B are similar to those in FIG. 9A and FIG. 9B except that the input stage circuit includes only one differential pair circuit. The hardware circuit area can thus be reduced as compared to the embodiments shown in FIG. 9A and FIG. 9B. The first differential pair circuit 101 in FIG. 10A and the third differential pair circuit 201 in FIG. 10B are both NMOS differential pairs. The operation for the driving circuit in FIG. 10A and FIG. 10B is similar to that shown in FIG. 9A and FIG. 9B, and thus is not repeated here. Embodiments in FIG. 11A and FIG. 11B are similar to those in FIG. 10A and FIG. 10B except that the NMOS differential pairs are replaced by the PMOS differential pairs. The second differential pair circuit 102 in FIG. 11A and the fourth differential pair circuit 202 in FIG. 11B are both PMOS differential pairs. The circuit architecture used in the embodiments in FIG. 10A-FIG. 11B are corresponding to the embodiment shown in FIG. 5.

Figure 12A:
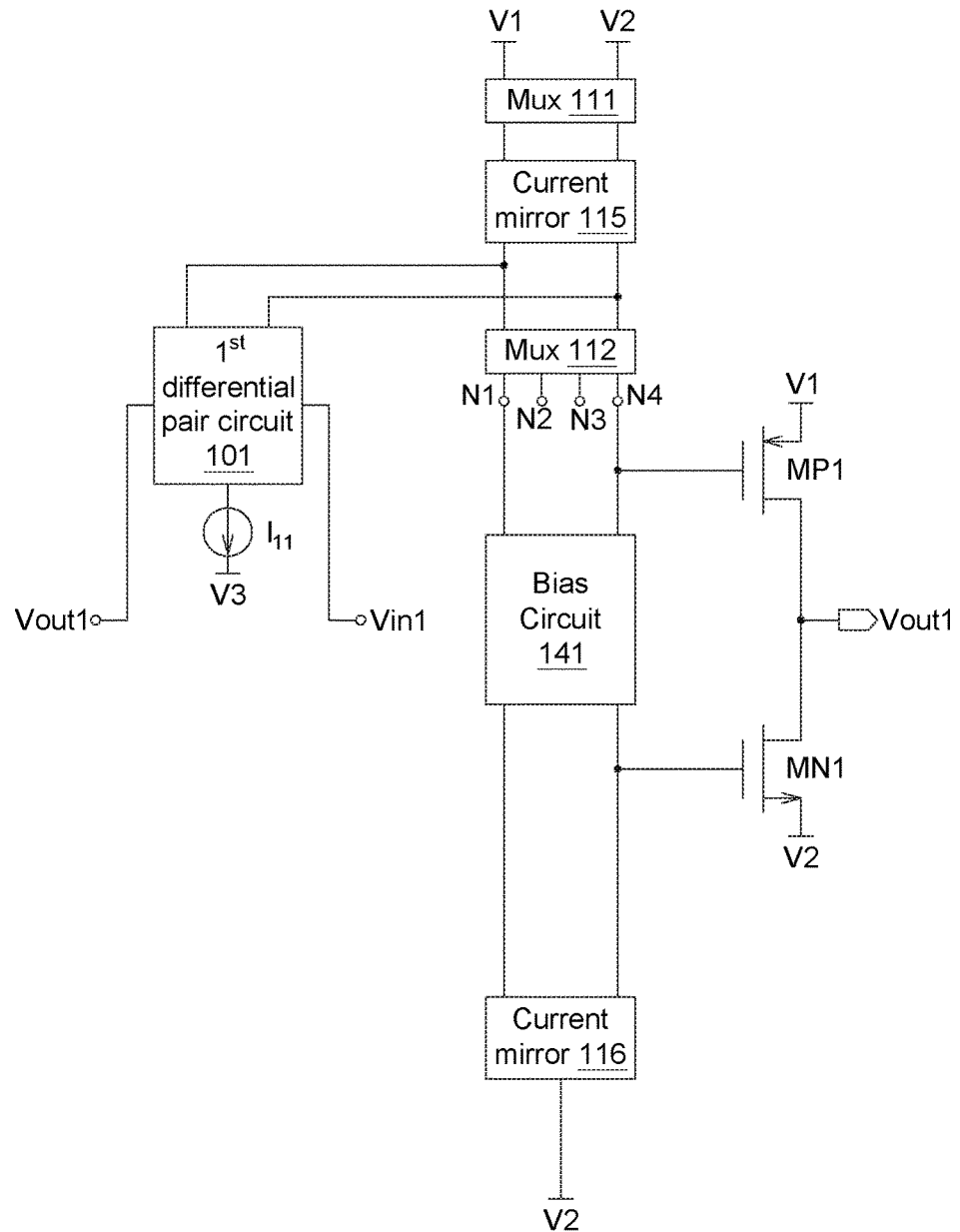
FIG. 12A shows an operational amplifier circuit according to one embodiment of the invention.
Figure 12B:
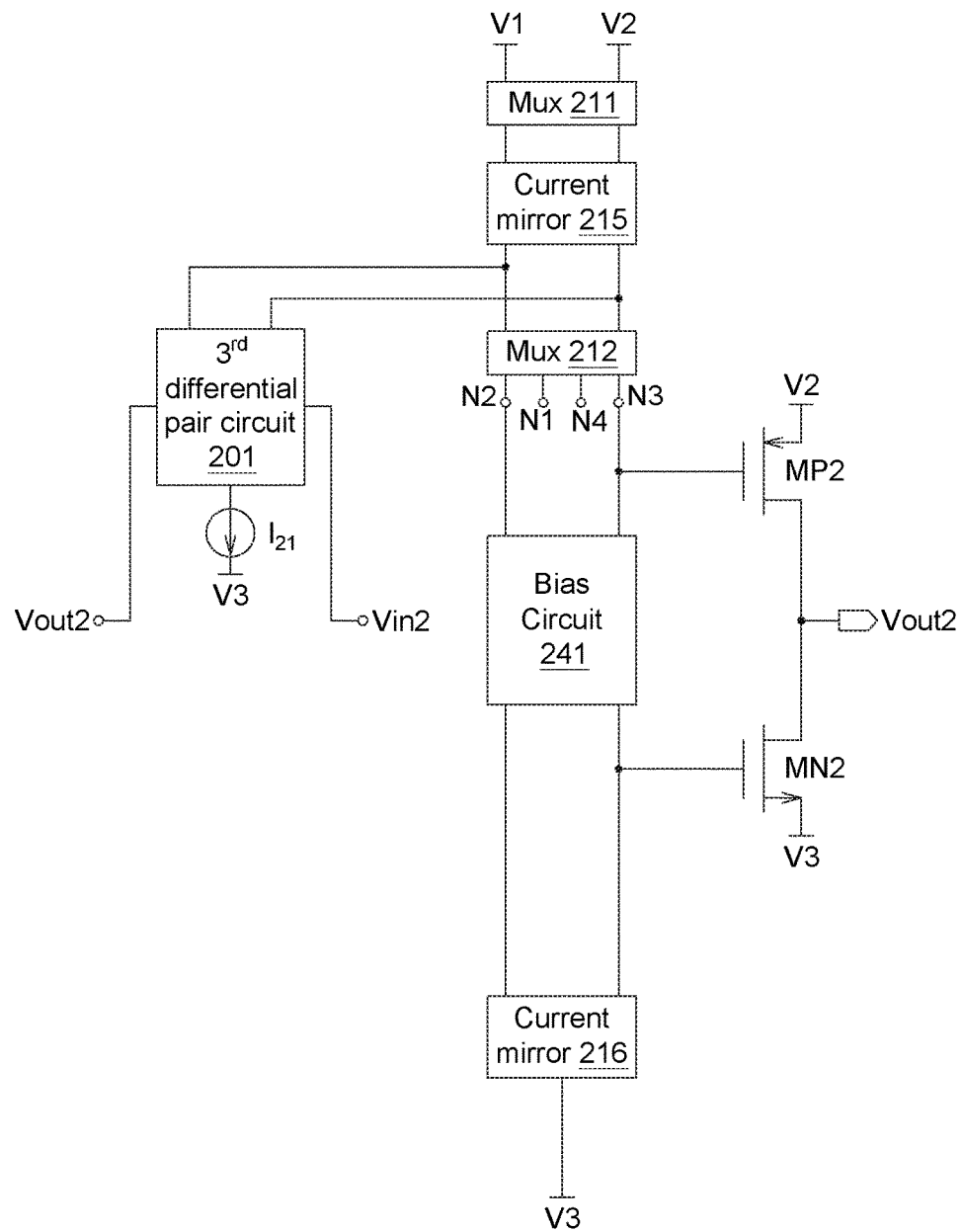
FIG. 12B shows an operational amplifier circuit that may be combined with the operational amplifier circuit shown in FIG. 12A according to one embodiment of the invention.

FIG. 12A and FIG. 12B show an even simpler hardware implementation for the driver circuit. In this embodiment, the first operational amplifier circuit includes one differential pair circuit (the first differential pair circuit 101) and one power switching circuit (mux 111 combined with mux 112). The second power switching circuit (mux 121 combined with mux 122) is removed in this embodiment. The corresponding block diagram may be referred in FIG. 3. When the first input signal Vin1 is in the first input range, the mux 111 selects the first supply voltage V1, and the mux 112 makes the input stage circuit in FIG. 12A coupled to the output stage circuit in FIG. 12A, which is powered by the first supply voltage V1 and the second supply voltage V2. The bias circuit 141 in FIG. 12A is coupled to the second supply voltage V2 through the current mirror 116. When the first input signal Vin1 is in the second input range, the mux 111 selects the second supply voltage V2, and the mux 112 makes the input stage circuit in FIG. 12A coupled to the output stage circuit in FIG. 12B, which is powered by the second supply voltage V2 and the third supply voltage V3. The bias circuit 241 in FIG. 12B is coupled to the third supply voltage V3 through the current mirror.

Figure 13A:
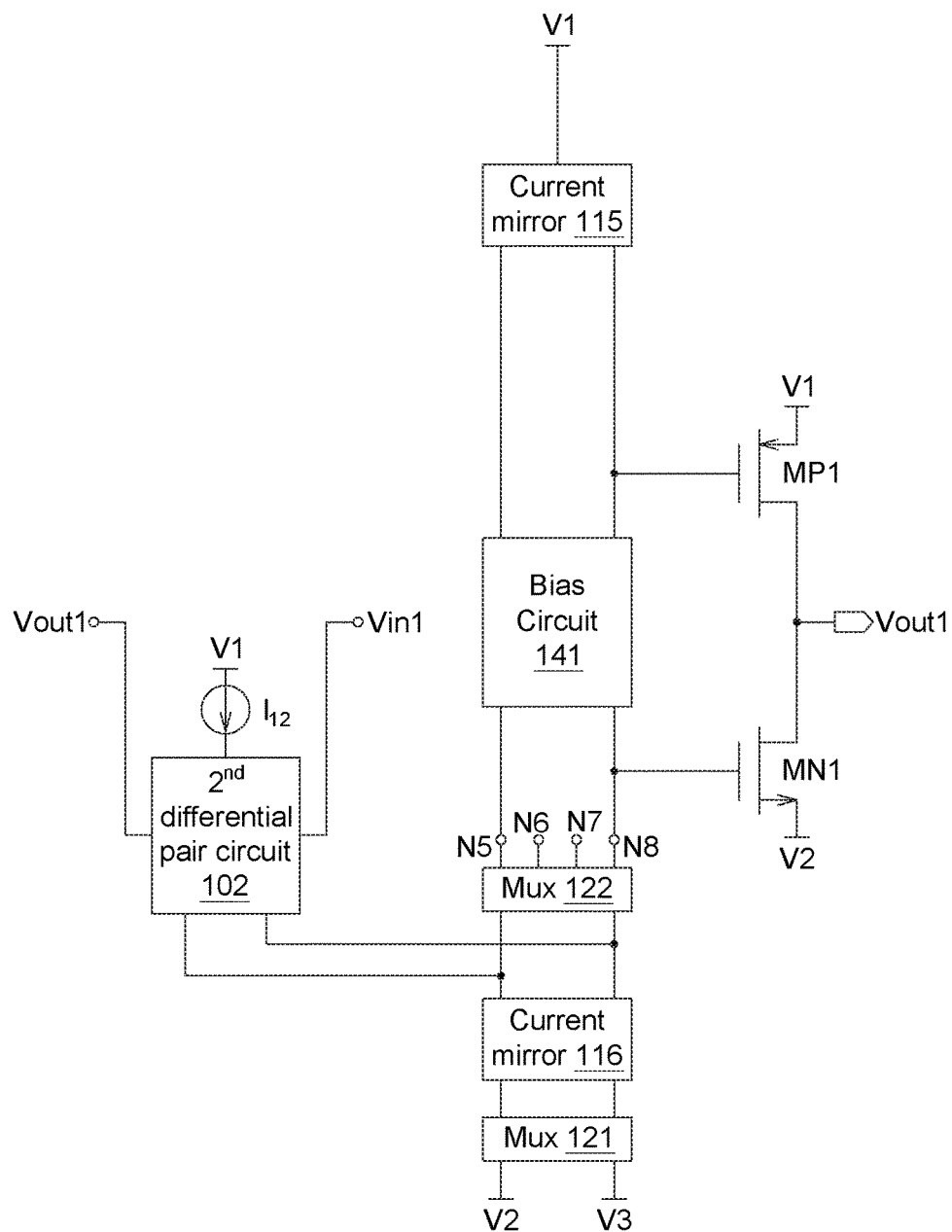
FIG. 13A shows an operational amplifier circuit according to one embodiment of the invention.
Figure 13B:
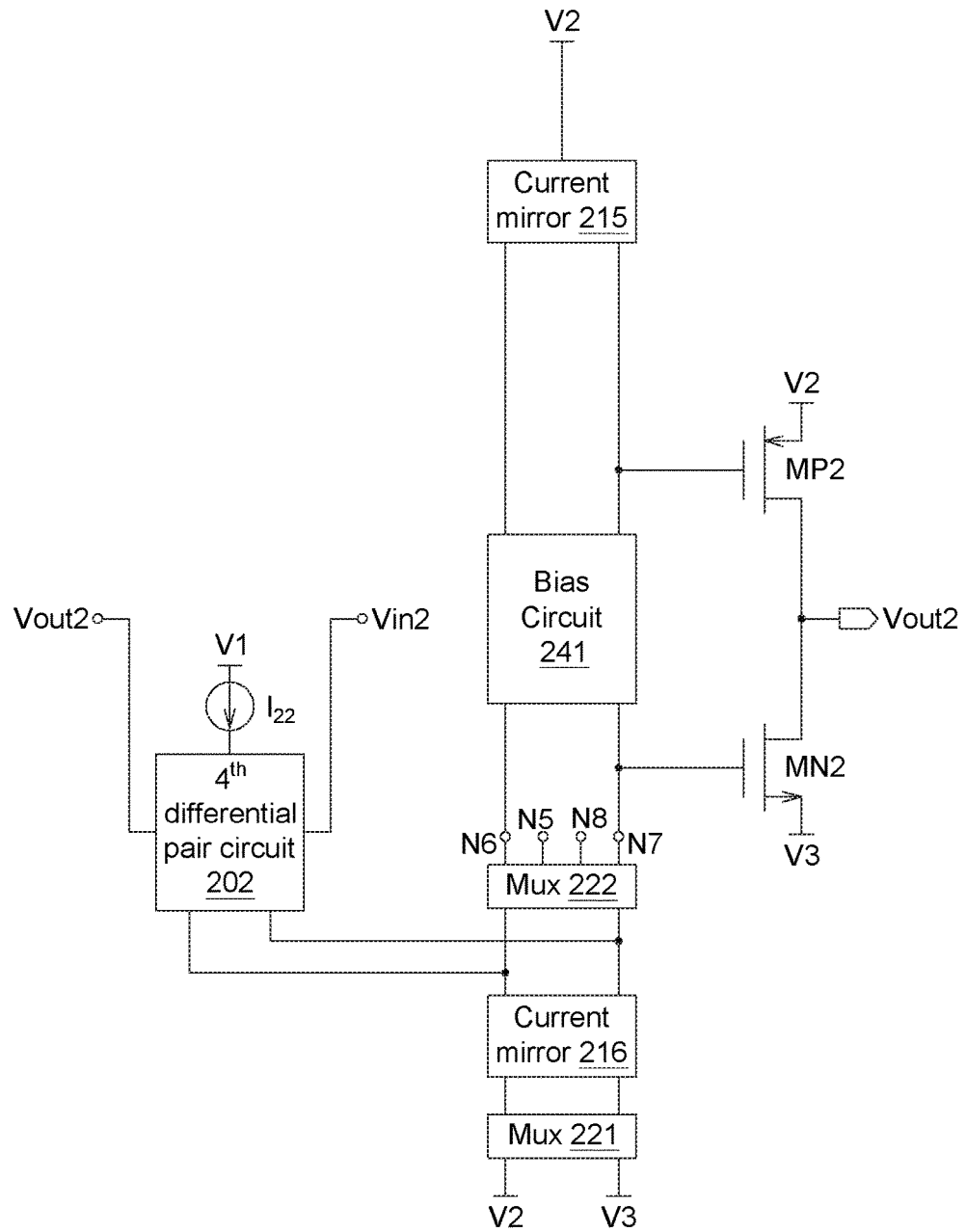
FIG. 13B shows an operational amplifier circuit that may be combined with the operational amplifier circuit shown in FIG. 13A according to one embodiment of the invention.

In this embodiment, the required hardware area is reduced because the number of multiplexers required is reduced. Moreover, the wiring cost can also be reduced because only four wire connections (N1-N4) are required between the first operational amplifier circuit and the second operational amplifier circuit as compared to the eight wire connections in the previous embodiments. Embodiments in FIG. 13A and FIG. 13B are similar to those in FIG. 12A and FIG. 12B except that the NMOS differential pairs are replaced by the PMOS differential pairs.

Figure 14A:
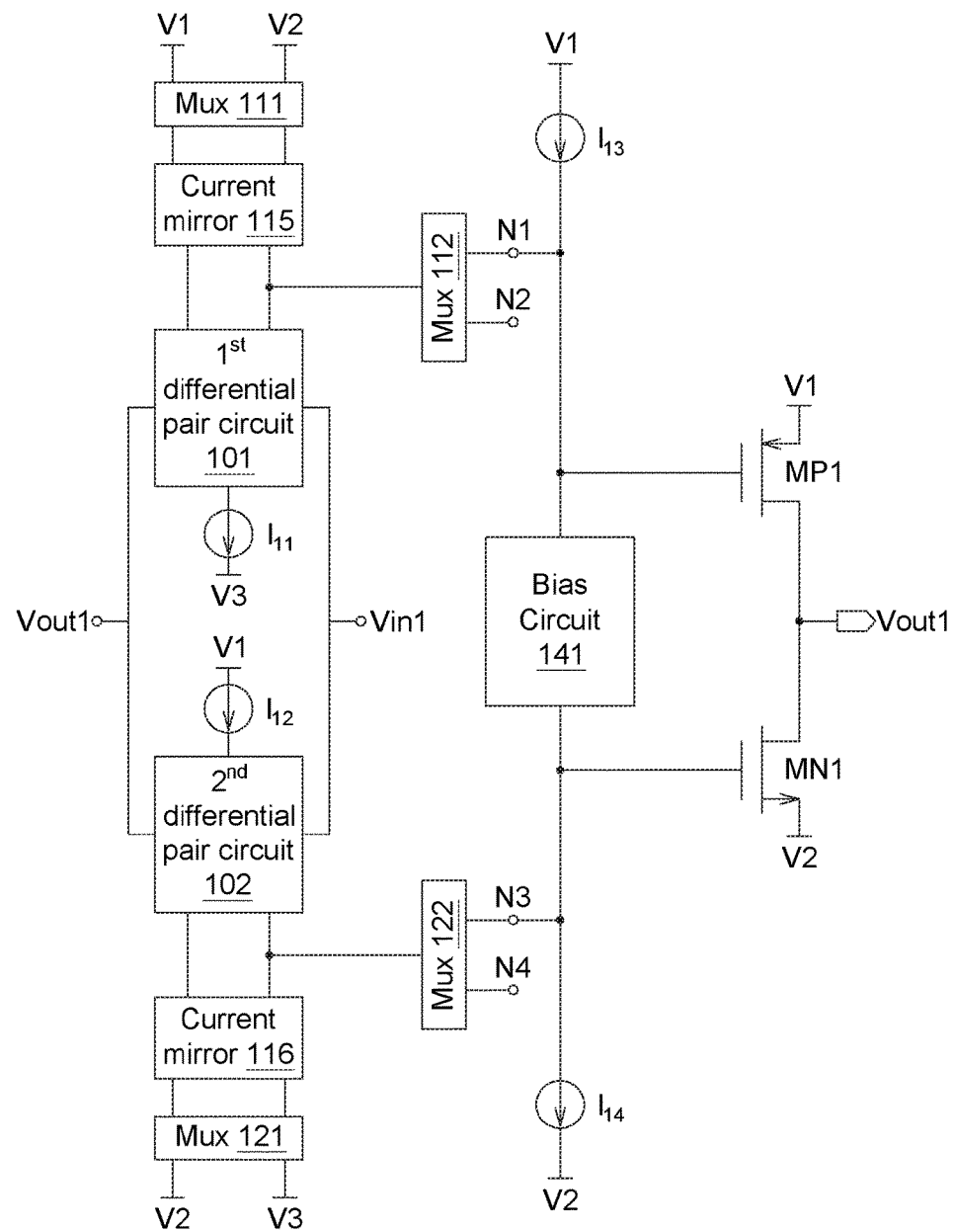
FIG. 14A shows an operational amplifier circuit according to one embodiment of the invention.
Figure 14B:
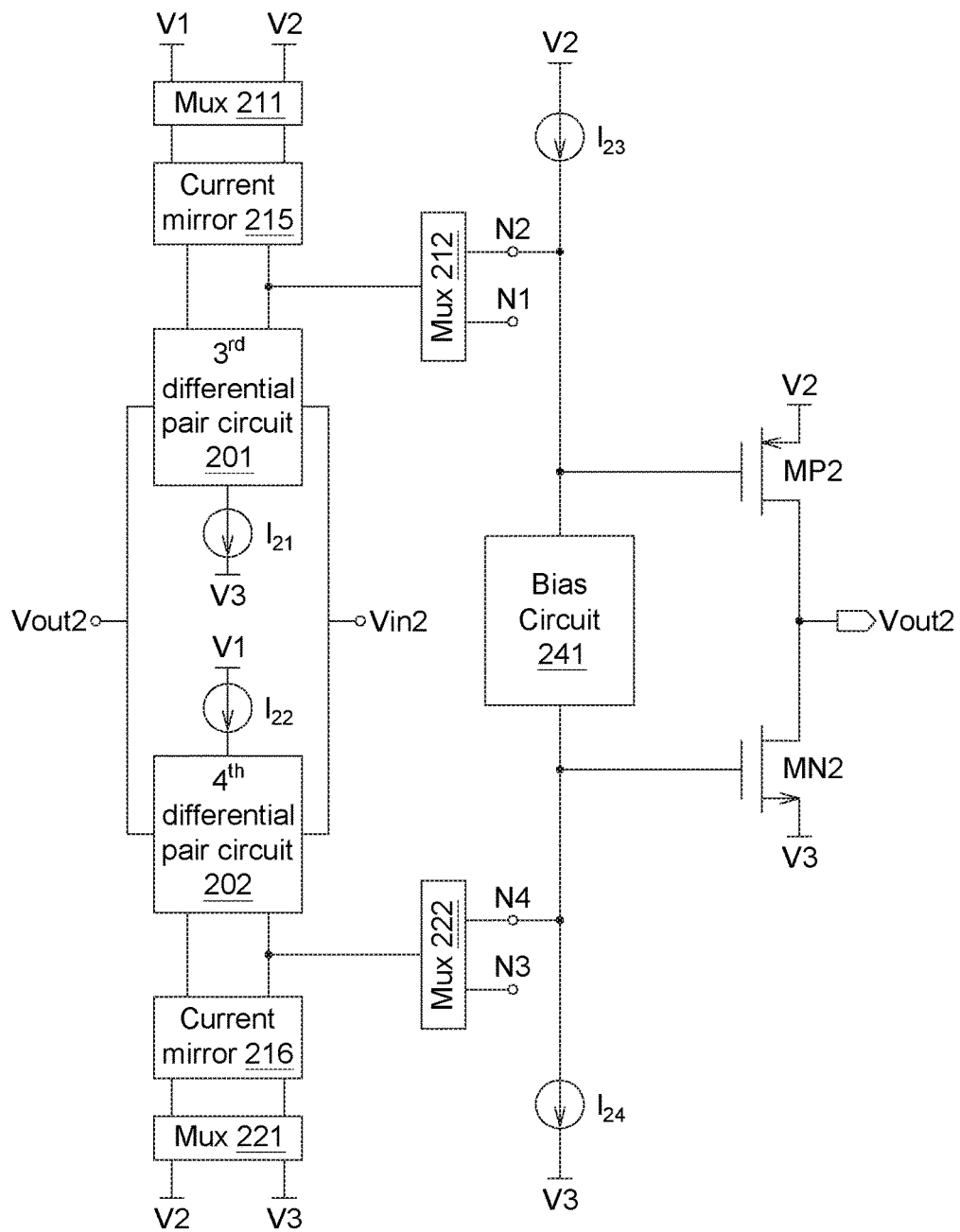
FIG. 14B shows an operational amplifier circuit that may be combined with the operational amplifier circuit shown in FIG. 14A according to one embodiment of the invention.
Figure 15A:
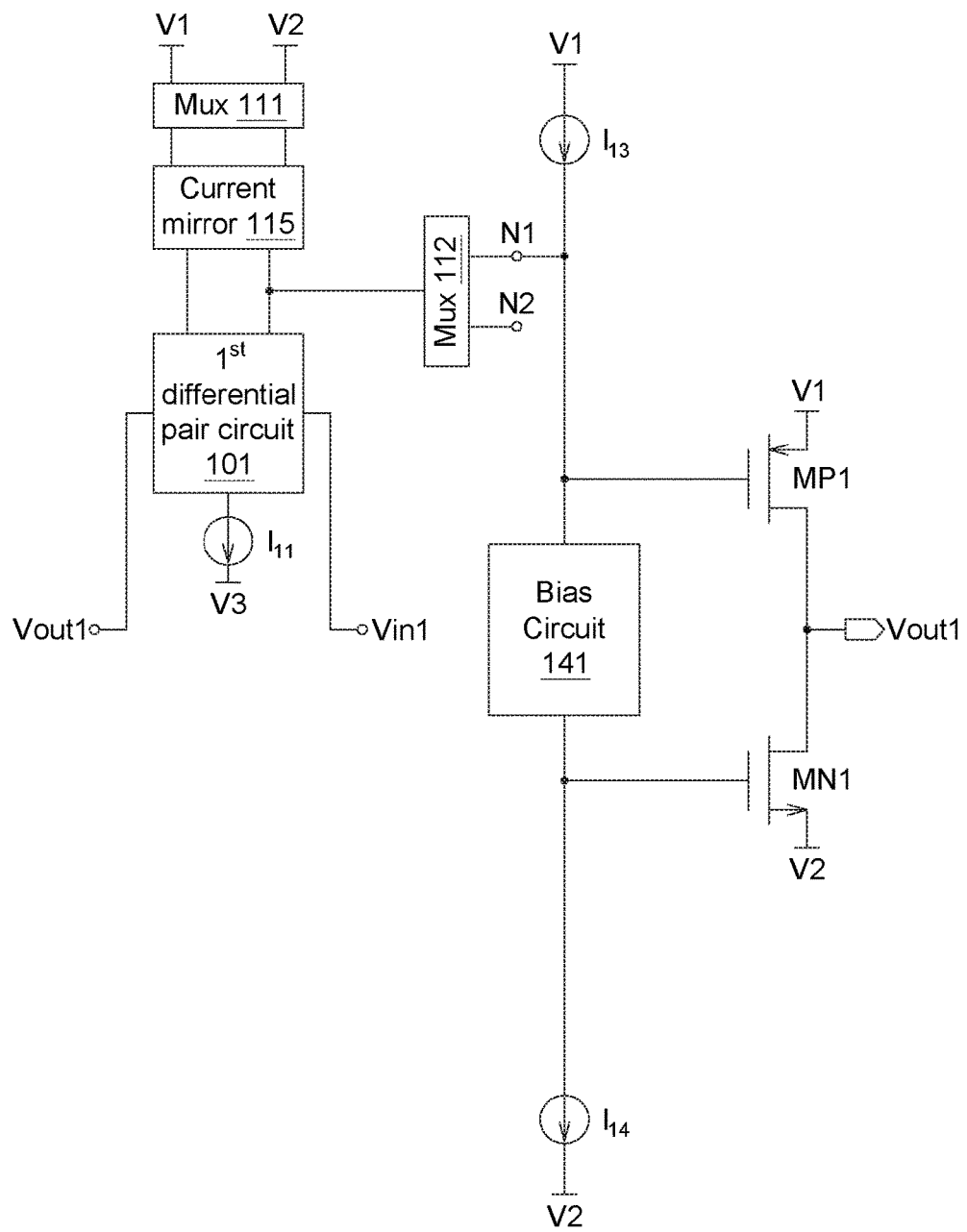
FIG. 15A shows an operational amplifier circuit according to one embodiment of the invention.
Figure 15B:
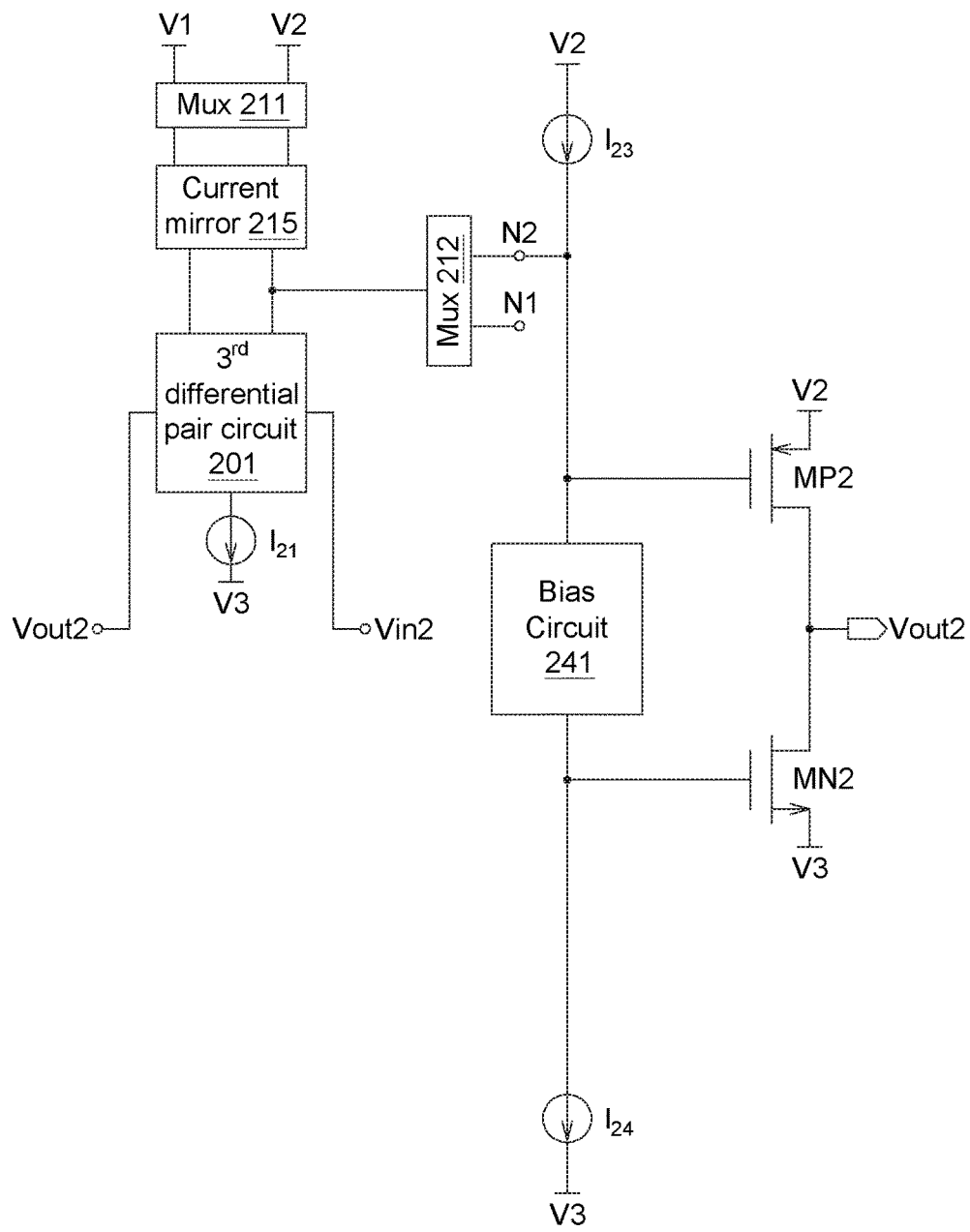
FIG. 15B shows an operational amplifier circuit that may be combined with the operational amplifier circuit shown in FIG. 15A according to one embodiment of the invention.

FIG. 14A and FIG. 14B show a different circuit structure for the operational amplifier circuit. In this embodiment, the current source $I_{13}$ and the current source $I_{14}$ set the operating point for the bias circuit 141. The current source $I_{23}$ and the current source $I_{24}$ set the operating point for the bias circuit 241. The bias circuit 141 has two connection terminals, whereas the bias circuit 141 in FIG. 9A has four connection terminals. The mux 112 is a 2-to-1 multiplexer, whereas the mux 112 in FIG. 9A is a 4-to-1 multiplexer. Four connection wires (N1 to N4) are required between the first operational amplifier circuit and the second operational amplifier circuit. The hardware cost can be reduced as compared to the embodiment in FIG. 9A because of fewer wirings and the simplified multiplexer. The operation in this embodiment, including switching different supply voltage levels and switching the connection between the input stage circuits and the output stage circuits, is similar to the embodiment in FIG. 9A.

Figure 16A:
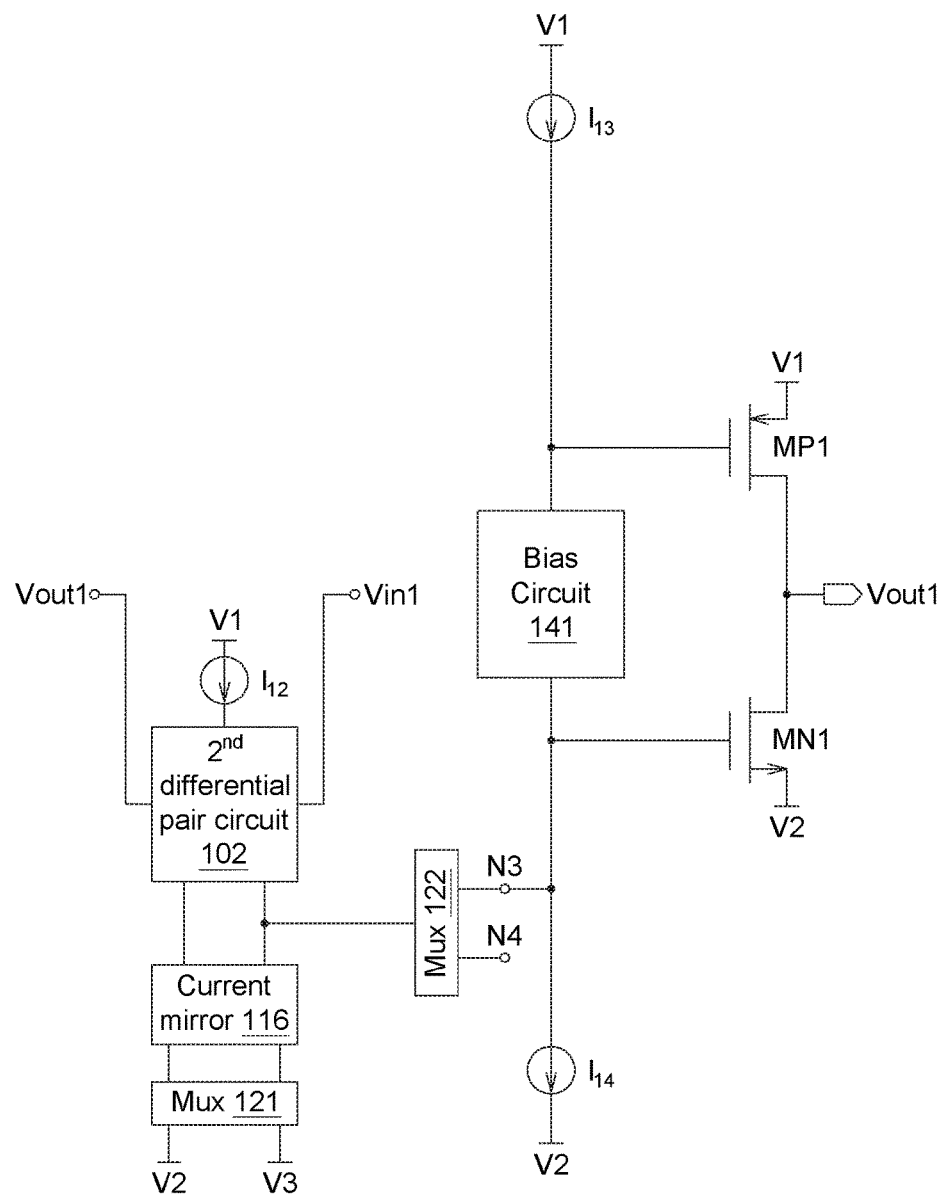
FIG. 16A shows an operational amplifier circuit according to one embodiment of the invention.
Figure 16B:
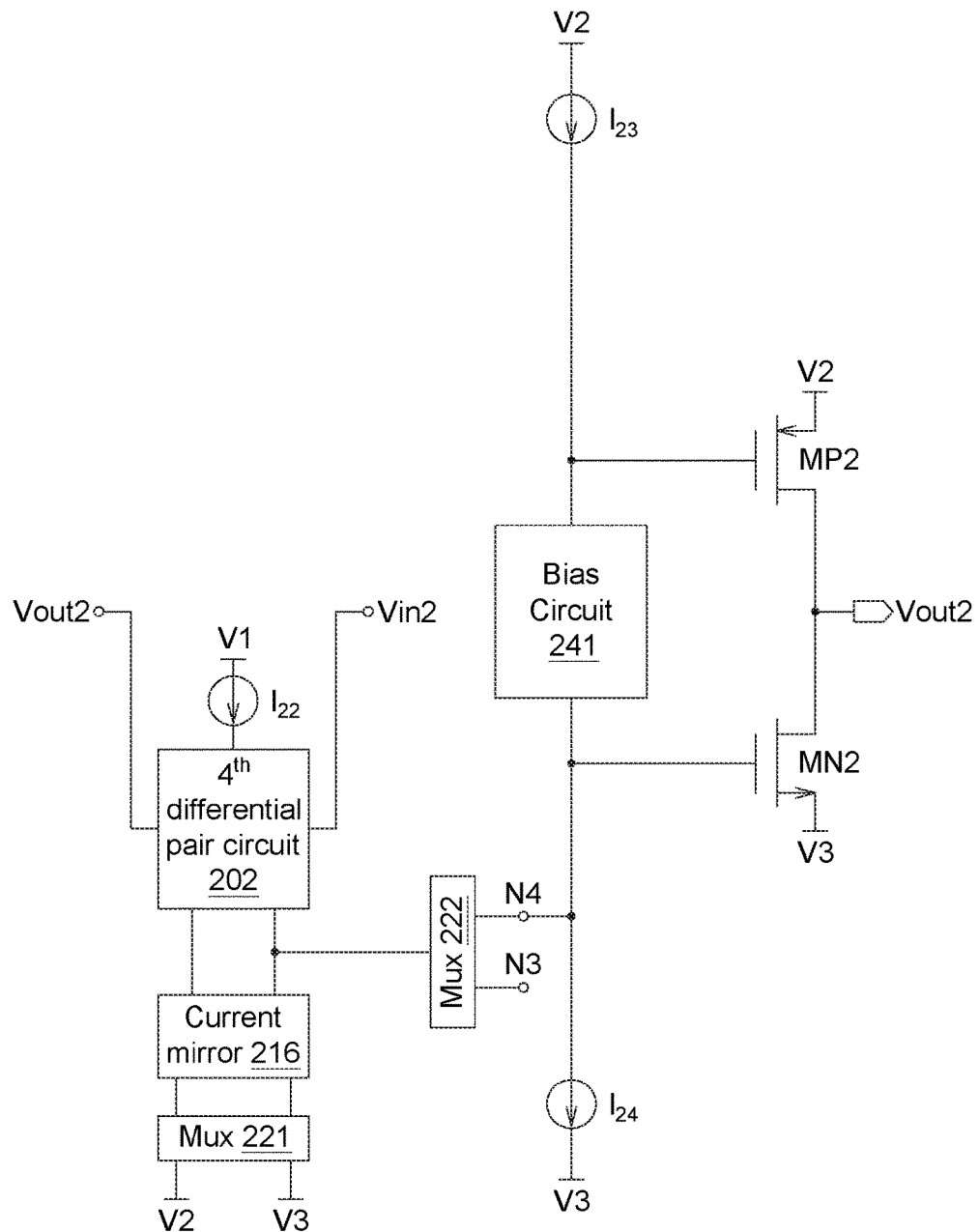
FIG. 16B shows an operational amplifier circuit that may be combined with the operational amplifier circuit shown in FIG. 16A according to one embodiment of the invention.

FIG. 15A-FIG. 16B show embodiments by modifying the embodiment in FIG. 14A and FIG. 14B to the single differential pair circuit architecture, hence further reducing the hardware circuit area. The first differential pair circuit 101 in FIG. 15A and the third differential pair circuit 201 in FIG. 15B are both NMOS differential pairs. In this embodiment, only two wire connections (N1 and N2) are required between the first operational amplifier circuit and the second operational amplifier circuit. Embodiments in FIG. 16A and FIG. 16B are similar to those in FIG. 15A and FIG. 15B except that the NMOS differential pairs are replaced by the PMOS differential pairs. The second differential pair circuit 102 in FIG. 16A and the fourth differential pair circuit 202 in FIG. 16B are both PMOS differential pairs.

According to the embodiments provided above, the operational amplifier circuit in this disclosure includes a power switching circuit configured to switch between different supply voltage levels according to the voltage level of the input signal. Two operational amplifier circuits may be combined to create a driver circuit capable of switching supply voltage levels. By setting the appropriate supply voltage level and coupling relationship, the driver circuit can work properly and the power consumption of the driver circuit can be reduced. For example, the power consumption can be reduced by half if the half range is supplied to the driver circuit. Moreover, several different circuit implementations are provided in this disclosure. Some circuit simplification techniques are also included in these embodiments to reduce the hardware cost. It can be seen that the power saving capability can be introduced to the driver circuit without incurring much area overhead.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A driver circuit, comprising:
   a first operational amplifier circuit, comprising:
      a first input stage circuit, for receiving a first input signal and amplifying the first input signal to generate a first amplified signal; and
      a first output stage circuit, for generating a first output signal;
   a second operational amplifier circuit, comprising:
      a second input stage circuit, for receiving a second input signal and amplifying the second input signal to generate a second amplified signal; and
      a second output stage circuit, for generating a second output signal; and
   a power switching circuit, coupled to the first input stage circuit and the second input stage circuit, the power switching circuit comprising:
      a first output terminal, for outputting one of the first amplified signal and the second amplified signal in response to a control signal; and
      a second output terminal, for outputting the other of the first amplified signal and the second amplified signal in response to the control signal;
   wherein the first output stage circuit is coupled to the first output terminal of the power switching circuit, the second output stage circuit is coupled to the second output terminal of the power switching circuit, and the power switching circuit is configured to switch a first power supply for both the first input stage circuit and the second input stage circuit between a first supply voltage and a second supply voltage in response to the control signal.

2. The driver circuit according to claim 1, wherein the first input signal has an input range dynamically varied between a first input range and a second input range, and the control signal indicates whether the first input signal is in the first input range or the second input range.

3. The driver circuit according to claim 1, wherein the first input stage circuit comprises a first differential pair circuit, coupled to a third supply voltage through a first current source, the second input stage circuit comprises a third differential pair circuit, coupled to the third supply voltage through a third current source, and the second supply voltage is between the first supply voltage and the third supply voltage.

4. The driver circuit according to claim 3, wherein the first differential pair circuit is an NMOS differential pair circuit, the third differential pair circuit is another NMOS differential pair circuit, and the first supply voltage is greater than the second supply voltage, the second supply voltage is greater than the third supply voltage.

5. The driver circuit according to claim 3, wherein the first differential pair circuit is a PMOS differential pair circuit, the third differential pair is another PMOS differential pair circuit, and the third supply voltage is greater than the second supply voltage, the second supply voltage is greater than the first supply voltage.

6. The driver circuit according to claim 3, wherein the first output stage circuit is power supplied by the first supply voltage and the second supply voltage, and the second output stage circuit is power supplied by the second supply voltage and the third supply voltage.

7. The driver circuit according to claim 3, wherein the power switching circuit is further configured to switch a second power supply for both the first input stage circuit and the second input stage circuit between the second supply voltage and the third supply voltage.

8. The driver circuit according to claim 7, wherein the first input stage circuit further comprises a second differential pair circuit, coupled to the first supply voltage through a second current source, the second input stage circuit further comprises a fourth differential pair circuit, coupled to the first supply voltage through a fourth current source, the first supply voltage is greater than the second supply voltage, and the second supply voltage is greater than the third supply voltage.

9. An operational amplifier circuit in a driver circuit for driving a panel, comprising:
   an input stage circuit, for receiving a gamma voltage as an input signal and amplifying the input signal to generate an amplified signal, wherein the input signal has an input range dynamically varied between a first input range and a second input range;
   an output stage circuit, coupled to the input stage circuit for receiving the amplified signal to generate an output signal; and
   a first power switching circuit, coupled to the input stage circuit for switching a first power supply for the input stage circuit between a first supply voltage and a second supply voltage according to whether the input signal is in the first input range or the second input range.

10. The operational amplifier circuit according to claim 9, wherein the input stage circuit comprises a first differential pair circuit coupled to the first power switching circuit through a first current source and coupled to a third supply voltage through a second current source.

11. The operational amplifier circuit according to claim 10, wherein the second supply voltage is between the first supply voltage and the third supply voltage.

12. The operational amplifier circuit according to claim 10, wherein the first differential pair circuit is an NMOS differential pair circuit, and the first supply voltage is greater than the second supply voltage, the second supply voltage is greater than the third supply voltage.

13. The operational amplifier circuit according to claim 10, wherein the first differential pair circuit is a PMOS differential pair circuit, and the third supply voltage is greater than the second supply voltage, the second supply voltage is greater than the first supply voltage.

14. The operational amplifier circuit according to claim 10, wherein the output stage circuit is power supplied by the first supply voltage and the second supply voltage.

15. The operational amplifier circuit according to claim 14, wherein the output stage circuit comprises a bias circuit, wherein the bias circuit is coupled to the first supply voltage through a pull-up device, and coupled to the second supply voltage through a pull-down device.

16. The operational amplifier circuit according to claim 10, wherein the output stage circuit is power supplied by the second supply voltage and the third supply voltage.

17. The operational amplifier circuit according to claim 10, further comprising a second power switching circuit, coupled to the input stage circuit for switching a second power supply for the input stage circuit between the second supply voltage and the third supply voltage.

18. The operational amplifier circuit according to claim 17, wherein the input stage circuit further comprises a second differential pair circuit, coupled to the second power switching circuit through a third current source and coupled to the first supply voltage through a fourth current source.

19. The operational amplifier circuit according to claim 18, wherein the first supply voltage is greater than the second supply voltage, and the second supply voltage is greater than the third supply voltage.

20. The operational amplifier circuit according to claim 9, wherein the first power switching circuit comprises a multiplexer, configured to generate the first power supply for the input stage circuit by multiplexing the first supply voltage and the second supply voltage according to whether the input signal is in the first input range or the second input range.

21. The operational amplifier circuit according to claim 9, wherein the operational amplifier circuit further comprises a switching device, coupled between the input stage circuit and the output stage circuit, wherein the switching device is configured to multiplex the amplified signal and another amplified signal generated by another input stage circuit according to whether the input signal is in the first input range or the second input range.

\* \* \* \* \*